(12) United States Patent
Ku

(10) Patent No.: US 9,082,500 B1
(45) Date of Patent: Jul. 14, 2015

(54) NON-VOLATILE MEMORY

(71) Applicant: eMemory Technology Inc., Hsin-Chu (TW)

(72) Inventor: Wei-Ming Ku, New Taipei (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 14/487,578

(22) Filed: Sep. 16, 2014

Related U.S. Application Data

(60) Provisional application No. 61/925,653, filed on Jan. 10, 2014.

(51) Int. Cl.
  *G11C 16/28* (2006.01)
  *G11C 16/26* (2006.01)
  *G11C 5/06* (2006.01)

(52) U.S. Cl.
  CPC . *G11C 16/26* (2013.01); *G11C 5/06* (2013.01)

(58) Field of Classification Search
  None
  See application file for complete search history.

(56) References Cited

U.S. PATENT DOCUMENTS

| | | | | |
|---|---|---|---|---|
| 6,416,556 | B1* | 7/2002 | Park | 365/185.28 |
| 6,850,442 | B2 | 2/2005 | Tsai et al. | |
| 2007/0237001 | A1* | 10/2007 | Visconti et al. | 365/185.23 |
| 2014/0269064 | A1* | 9/2014 | Jeon et al. | 365/185.05 |

\* cited by examiner

*Primary Examiner* — James G Norman
(74) *Attorney, Agent, or Firm* — WPAT, PC; Justin King

(57) ABSTRACT

A non-volatile memory includes a memory array, a row decoder, a source line decoder, a column decoder, and a sensing circuit. The memory array is connected with m word lines, n source lines and n bit lines. The row decoder determines a selected row of n memory cells. The n memory cells in the selected row are connected with the n source lines and the n bit lines. By the source line decoder, an x-th source line is connected with a source line voltage but the other source lines of the n source lines are in a floating state. By the column decoder, an x-th bit line of the n bit lines is connected with a data line but the other bit lines are connected with a reference voltage. The sensing circuit determines a storing state of a selected memory cell.

11 Claims, 6 Drawing Sheets

# NON-VOLATILE MEMORY

This application claims the benefit of U.S. provisional patent application No. 61/925,653, filed Jan. 10, 2014, the subject matter of which is incorporated herein by reference.

FIELD OF THE INVENTION

The present invention relates to a non-volatile memory, and more particularly to a non-volatile memory with high speed sensing capability.

BACKGROUND OF THE INVENTION

FIG. 1 is a schematic circuit diagram illustrating a conventional non-volatile memory. As shown in FIG. 1, the non-volatile memory comprises a memory array, a row decoder 110, a column decoder 130, and a sensing circuit 140. The row decoder 110 is connected with m word lines WL1~WLm. The column decoder 130 is connected with n bit lines BL1~BLn.

Moreover, the memory array is connected with the m word lines WL1~WLm, the n bit lines BL1~BLn and a source line SL. The memory array comprises m×n memory cells C11~Cmn. Each of the memory cells comprises a floating gate transistor. Moreover, each of the memory cells is connected with the corresponding word line, the corresponding bit line and the source line SL. Take the memory cell C11 as an example. The control gate terminal of the floating gate transistor is connected with the word line WL1, the drain terminal of the floating gate transistor is connected with the bit line BL1, and the source terminal of the floating gate transistor is connected with the source line SL.

Generally, the storing state of the memory cell is determined according to the amount of the hot carriers (or charges) stored in the floating gate of the floating gate transistor. For example, if the hot carriers are injected into the floating gate, the memory cell has a first storing state (e.g. the storing state "0"). Whereas, if no hot carriers are injected into the floating gate, the memory cell has a second storing state (e.g. the storing state "1").

The column decoder 130 comprises n switch transistors My1~Myn. According to a column control signal Y[1:n], the column decoder 130 generates n column switch signals Y1~Yn. According to the n column switch signals Y1~Yn, one of the n switch transistors My1~Myn is in a close state but the others of the n switch transistors My1~Myn are in an open state.

Generally, during a read cycle, the row decoder 110 enables a word line to determine a selected row of n memory cells. Moreover, according to the column control signal Y[1:n], the column decoder 130 determines a selected memory cell from the selected row of n memory cells. Then, the sensing circuit 140 judges the storing state of the selected memory cell.

For example, if the word line WL2 is enabled by the row decoder 110, the second row of memory cells are determined. That is, one of the n memory cells C21~C2n will be determined as the selected memory cell. Moreover, if the column switch signal Y1 is enabled, only the switch transistor My1 is in the close state but the other switch transistors My2~Myn are in the open state. Under this circumstance, the bit line BL1 is connected with a data line DL, but the other bit lines BL2~BLn are not connected with the data line DL. Consequently, the memory cell C21 is the selected memory cell, and the sensing circuit 140 further judges the storing state of the selected memory cell.

As shown in FIG. 1, the sensing circuit 140 comprises a transistor Mn1, a transistor Mn2, a transistor Mp1, an operation amplifier OP1 and an operation amplifier OP2.

The source terminal of the transistor Mp1 is connected with a first supply voltage source Vdd (e.g. 3.3V). The gate terminal of the transistor Mp1 receives a bias voltage Vbias. The drain terminal of the transistor Mp1 is connected with a node b. Consequently, the transistor Mp1 is served as a reference current source for generating a reference current Iref to the node b.

The drain terminal of the transistor Mn1 and the data line DL are connected with a node a. The gate terminal of the transistor Mn1 is connected with a node c. The source terminal of the transistor Mn1 is connected with a second supply voltage source Vss (e.g. a ground voltage GND). The drain terminal of the transistor Mn2 is connected with the node b. The gate terminal of the transistor Mn2 is connected with the node c. The source terminal of the transistor Mn2 is connected with the second supply voltage source Vss.

A positive input terminal of the operation amplifier OP1 is connected with the node a. A negative input terminal of the operation amplifier OP1 receives a comparing voltage VDL (e.g. 0.4V). An output terminal of the operation amplifier OP1 is connected with the node c. Consequently, a current mirror is defined by the transistor Mn1, the transistor Mn2 and the operation amplifier OP1. The drain terminal of the transistor Mn1 is an input terminal of the current mirror for inputting a cell current Icell. The drain terminal of the transistor Mn2 is a mirroring terminal for generating a mirroring current.

A positive input terminal of the operation amplifier OP2 is connected with the node a. A negative input terminal of the operation amplifier OP2 is connected with the node b. An output terminal of the operation amplifier OP2 generates an output signal OUT to indicate the storing state of the selected memory cell. The principle of judging the storing state of the selected memory cell by the sensing circuit 140 will be illustrated as follows.

For realizing the storing state of the memory cell C21 during the read cycle, the source line SL is firstly pre-charged to a source line voltage VSL (e.g. 2V). Then, the word line WL2 is enabled by the row decoder 110 and the column switch signal Y1 is enabled by the column decoder 130. Consequently, the selected memory cell C21 is determined.

FIG. 2 is a schematic circuit diagram illustrating the relationship between the sensing circuit and the selected memory cell C21 of the conventional non-volatile memory. The principles of judging the storing state of the selected memory cell C21 by the sensing circuit 140 will be illustrated as follows. In the case that the memory cell C21 is the selected memory cell, the switch transistor My1 is in the close state and the bit line BL1 is connected with the data line DL. Consequently, the cell current Icell generated by the selected memory cell C21 is transmitted from the bit line BL1 to the data line DL through the switch transistor My1, and then inputted into the sensing circuit 140.

When the sensing circuit 140 starts to receive the cell current Icell, the voltage Va at the node a (i.e. the voltage at the data line DL) is discharged from the source line voltage VSL to the comparing voltage VDL. Moreover, when the voltage Va at the node a is discharged to the comparing voltage VDL, the voltage Va at the node a and the voltage Vb at the node b are compared with each other by the operation amplifier OP2. Consequently, the operation amplifier OP2 generates the output signal OUT to indicate the storing state of the selected memory cell C21.

For example, if the selected memory cell C21 has the first storing state (e.g. the storing state "0"), the cell current Icell is higher than the reference current Iref. When the voltage Va at the node a is discharged to the comparing voltage VDL, the voltage Vb at the node b is discharged to a magnitude near the second supply voltage source Vss. Under this circumstance, the voltage Va at the node a is higher than the voltage Vb at the node b. Consequently, the output signal OUT from the operation amplifier OP2 is in a high level state to indicate that the storing state of the selected memory cell C21 is the first storing state.

On the other hand, if the selected memory cell C21 has the second storing state (e.g. the storing state "1"), the cell current Icell is lower than the reference current Iref. When the voltage Va at the node a is discharged to the comparing voltage VDL, the voltage Vb at the node b is maintained at a magnitude near the first supply voltage source Vdd. Under this circumstance, the voltage Va at the node a is lower than the voltage Vb at the node b. Consequently, the output signal OUT from the operation amplifier OP2 is in a low level state to indicate that the storing state of the selected memory cell C21 is the second storing state.

From the above discussions, during the read cycle of the conventional non-volatile memory, the storing state of the selected memory cell C21 can be realized according to the output signal OUT. However, until the voltage Va at the node a (i.e. the voltage at the data line DL) is discharged to the comparing voltage VDL, the sensing circuit 140 compares the voltage Va at the node a and the voltage Vb at the node b so as to generate the output signal OUT.

In other words, there is a delaying time Td between the start time point of the read cycle and the time point of generating the output signal OUT. After the components of the delaying time Td are analyzed, the following analyzing result is obtained. For example, the delaying period caused by the operations of the row decoder 110 and the column decoder 130 is about 0.2209×Td, the delaying period caused by the discharging time of the data line DL is about 0.4244×Td, and the delaying period caused by the operations of the sensing circuit 140 is about 0.3547×Td.

Obviously, during the read cycle of the conventional non-volatile memory, if the discharging time of the data line DL is too long, the access time of the memory cell is increased. In other words, if the discharging time of the data line DL is shortened, the read speed of the memory cell can be effectively enhanced.

SUMMARY OF THE INVENTION

The present invention provides a non-volatile memory comprising a source line decoder and a column decoder for shortening the discharging time of the data line and effectively enhancing the read speed of the memory cell.

An embodiment of the present invention provides a non-volatile memory. The non-volatile memory includes a memory array, a row decoder, a source line decoder, a column decoder, and a sensing circuit. The memory array includes m×n memory cells. The memory array is connected with m word lines, n source lines and n bit lines. The row decoder is connected with the m word lines for enabling one of the m word lines, thereby determining a selected row of n memory cells. The n memory cells in the selected row are connected with the n source lines and the n bit lines. The source line decoder is connected with the n source lines. By the source line decoder, an x-th source line of the n source lines is connected with a source line voltage but the other source lines of the n source lines are in a floating state. The column decoder is connected with the n bit lines. By the column decoder, an x-th bit line of the n bit lines is connected with a data line but the other bit lines of the n bit lines are connected with a reference voltage. The sensing circuit is connected with the column decoder through the data line. The sensing circuit determines a storing state of a selected memory cell according to a memory current flowing through the data line, wherein x is a positive integer and 1≤x≤n.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 3:
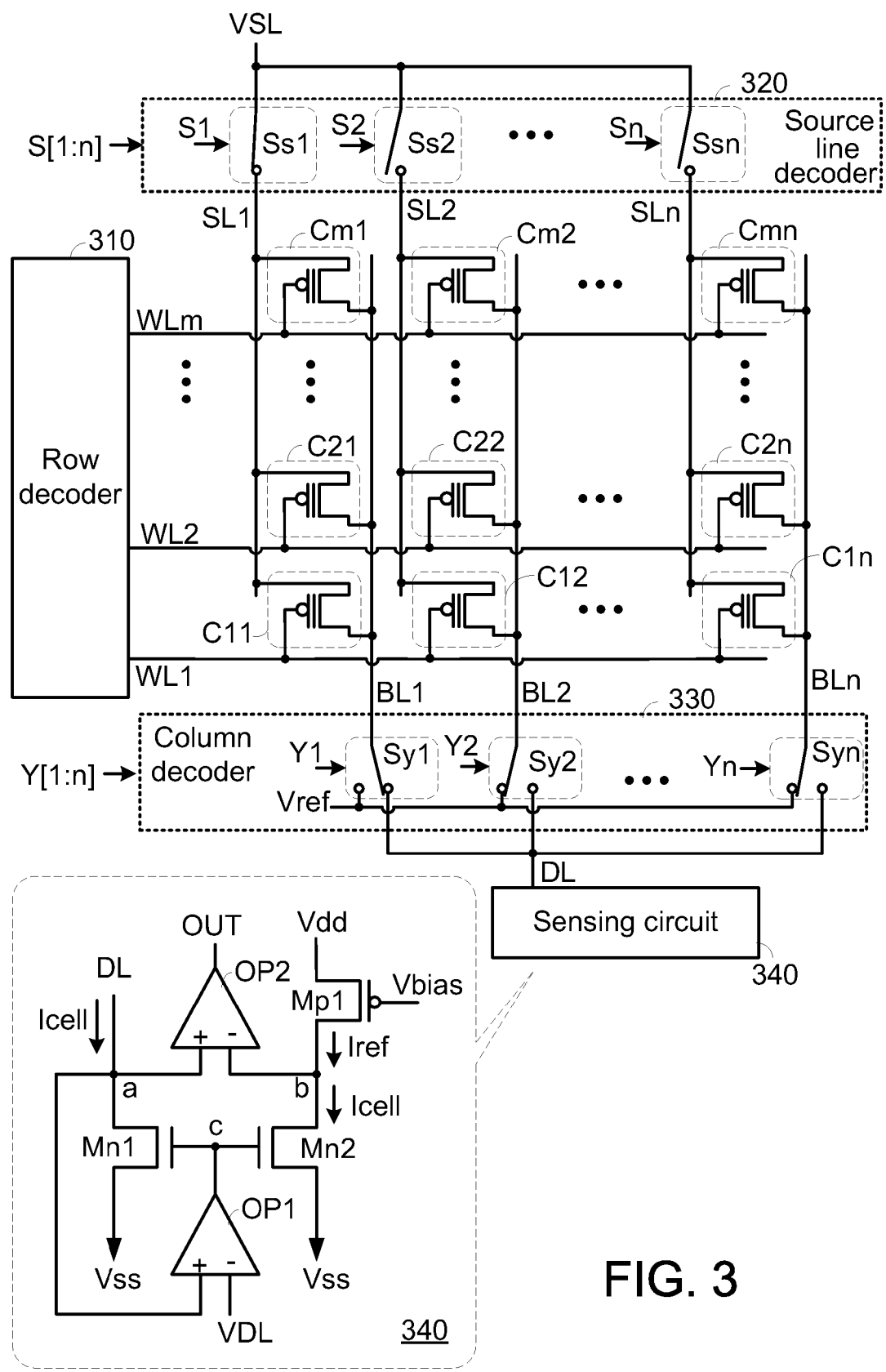
FIG. 3 is a schematic circuit diagram illustrating a non-volatile memory according to an embodiment of the present invention.

FIG. 3 is a schematic circuit diagram illustrating a non-volatile memory according to an embodiment of the present invention. As shown in FIG. 3, the non-volatile memory comprises a memory array, a row decoder 310, a source line decoder 320, a column decoder 330, and a sensing circuit 340. The row decoder 310 is connected with m word lines WL1~WLm. The source line decoder 320 is connected with n source lines SL1~SLn. The column decoder 330 is connected with n bit lines BL1~BLn.

Moreover, the memory array is connected with the m word lines WL1~WLm, the n source lines SL1~SLn and the n bit lines BL1~BLn. The memory array comprises m×n memory cells C11~Cmn. Each of the memory cells comprises a floating gate transistor. Moreover, each of the memory cells is connected with the corresponding word line, the corresponding bit line and the corresponding source line. Take the memory cell C11 as an example. The control gate terminal of the floating gate transistor is connected with the word line WL1, the drain terminal of the floating gate transistor is connected with the bit line BL1, and the source terminal of the floating gate transistor is connected with the source line SL1.

The source line decoder 320 comprises n switch units Ss1~Ssn. According to a source control signal S[1:n], the source line decoder 320 generates n source switch signals S1~Sn. According to the n source switch signals S1~Sn, one of the n switch units Ss1~Ssn is in a close state but the others of the n switch units Ss1~Ssn are in an open state. For example, as shown in FIG. 3, the switch unit Ss1 of the source line decoder 320 is in the close state, but the other switch units Ss2~Ssn of the source line decoder 320 are in the open state. Since the switch unit Ss1 is in the close state, a source line voltage VSL is connected with the corresponding source line SL1 through the switch unit Ss1. Since the switch units Ss2~Ssn are in the open state, the source lines SL2~SLn are in a floating state.

The column decoder 330 comprises n switch units Sy1~Syn. According to a column control signal Y[1:n], the column decoder 330 generates n column switch signals Y1~Yn. According to the n column switch signals Y1~Yn, one of the n switch transistors Sy1~Syn is in a first switching state but the others of the n switch transistors Sy1~Syn are in a second switching state. For example, as shown in FIG. 3, the switch unit Sy1 of the column decoder 330 is in the first switching state, but the switch units Sy2~Syn of the column decoder 330 are in the second switching state. Since the switch unit Sy1 is in the first switching state, the corresponding bit line BL1 is connected with the data line DL through the switch unit Sy1. Since the switch units Ss2~Ssn are in the second switching state, the corresponding bit lines BL2~BLn are connected with a reference voltage Vref.

As shown in FIG. 3, the sensing circuit 340 comprises a transistor Mn1, a transistor Mn2, a transistor Mp1, an operation amplifier OP1 and an operation amplifier OP2.

The source terminal of the transistor Mp1 is connected with a first supply voltage source Vdd (e.g. 3.3V). The gate terminal of the transistor Mp1 receives a bias voltage Vbias. The drain terminal of the transistor Mp1 is connected with a node b. Consequently, the transistor Mp1 is served as a reference current source for generating a reference current Iref to the node b.

The drain terminal of the transistor Mn1 and the data line DL are connected with a node a. The gate terminal of the transistor Mn1 is connected with a node c. The source terminal of the transistor Mn1 is connected with a second supply voltage source Vss (e.g. a ground voltage GND). The drain terminal of the transistor Mn2 is connected with the node b. The gate terminal of the transistor Mn2 is connected with the node c. The source terminal of the transistor Mn2 is connected with the second supply voltage source Vss.

A positive input terminal of the operation amplifier OP1 is connected with the node a. A negative input terminal of the operation amplifier OP1 receives a comparing voltage VDL (e.g. 0.4V). An output terminal of the operation amplifier OP1 is connected with the node c. Consequently, a current mirror is defined by the transistor Mn1, the transistor Mn2 and the operation amplifier OP1. The drain terminal of the transistor Mn1 is an input terminal of the current mirror for inputting a cell current Icell. The drain terminal of the transistor Mn2 is a mirroring terminal for generating a mirroring current.

A positive input terminal of the operation amplifier OP2 is connected with the node a. A negative input terminal of the operation amplifier OP2 is connected with the node b. An output terminal of the operation amplifier OP2 generates an output signal OUT. The operation amplifier OP2 may be considered as a comparator. The output signal OUT from the operation amplifier OP2 indicates the storing state of a selected memory cell.

In an embodiment, the selected memory cell of the non-volatile memory is determined by the row decoder 310, the source line decoder 320 and the column decoder 330 collaboratively. Firstly, the row decoder 310 enables a word line to determine a selected row of n memory cells. Then, the source line decoder 320 and the column decoder 330 collaboratively determine a selected memory cell from the selected row of n memory cells. Then, the sensing circuit 340 judges the storing state of the selected memory cell.

In accordance with a feature of the present invention, if the switch unit Ssx of the source line decoder 320 is in the close state according to the source control signal S[1:n], the switch unit Syx of the column decoder 330 is in the first switching state according to the column control signal Y[1:n], wherein x is a positive integer and 1≤x≤n. In other words, the source line voltage VSL is connected with the corresponding source line SLx because the switch unit Ssx of the source line decoder 320 is in the close state, but the other source lines are in the floating state because the other switch units of the source line decoder 320 are in the open state. Moreover, the bit line BLx is connected with the data line DL because the switch unit Syx of the column decoder 330 is in the first switching state, and the other bit lines are connected with the reference voltage Vref because the other switch units are in the second switching state. In this embodiment, the reference voltage Vref is lower than the source line voltage VSL, and the reference voltage Vref is higher than or equal to the comparing voltage VDL. For example, the reference voltage Vref is 0.45V.

For realizing the storing state of the memory cell C21 during the read cycle, the source line SL is firstly pre-charged to a source line voltage VSL (e.g. 2V). Then, the word line WL2 is enabled by the row decoder 310. Then, according to a source control signal S[1:n], the switch unit Ss1 of the source line decoder 320 is in the close state but the other switch units Ss2~Ssn of the source line decoder 320 are in the open state. Moreover, according to a column control signal Y[1:n], the switch unit Sy1 of the column decoder 330 is in the first switching state, but the other switch elements Sy2~Syn of the column decoder 330 are in the second switching state. Consequently, the memory cell C21 is the selected memory cell.

Figure 4:
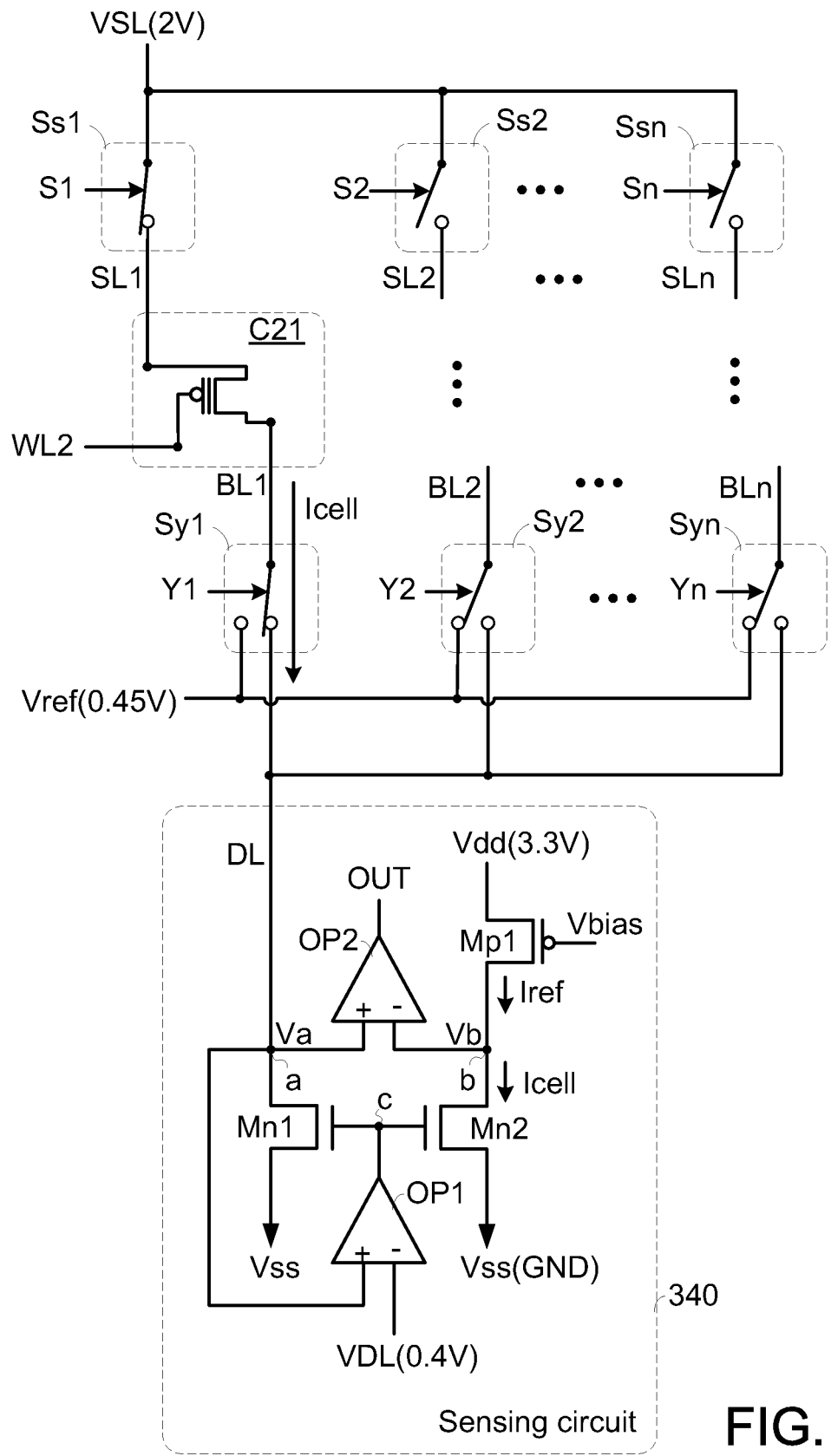
FIG. 4 is a schematic circuit diagram illustrating the relationship between the sensing circuit and the selected memory cell C21 of the non-volatile memory according to the embodiment of the present invention.

FIG. 4 is a schematic circuit diagram illustrating the relationship between the sensing circuit and the selected memory cell C21 of the non-volatile memory according to the embodiment of the present invention. The principles of judging the storing state of the selected memory cell C21 by the sensing circuit 340 will be illustrated as follows. In the case that the memory cell is the selected memory cell C21, the switch unit Ss1 of the source line decoder 320 is in the close state but the other switch units Ss2~Ssn of the source line decoder 320 are in the open state. Consequently, the source line voltage VSL is connected with the corresponding source line SL1 and the source lines SL2~SLn are in the floating state. Moreover, the switch unit Sy1 of the column decoder 330 is in the first switching state but the other switch elements Sy2~Syn of the column decoder 330 are in the second switching state. Consequently, the bit line BL1 is connected with the data line DL and the bit lines BL2~BLn are connected with the reference voltage Vref. Consequently, the cell current Icell generated by the selected memory cell C21 is transmitted from the bit line BL1 to the data line DL through the switch unit Sy1, and then inputted into the sensing circuit 340.

Since the switch unit Sy1 of the column decoder 330 is changed from the second switching state to the first switching state, when the sensing circuit 340 starts to receive the cell current Icell, the voltage Va at the node a (i.e. the voltage at the data line DL) is discharged from the reference voltage Vref to the comparing voltage VDL.

For example, if the selected memory cell C21 has the first storing state (e.g. the storing state "0"), the cell current Icell is higher than the reference current Iref. When the voltage Va at the node a is discharged to the comparing voltage VDL, the voltage Vb at the node b is discharged to a magnitude near the second supply voltage source Vss. Under this circumstance, the voltage Va at the node a is higher than the voltage Vb at the node b. Consequently, the output signal OUT from the operation amplifier OP2 is in a high level state to indicate that the storing state of the selected memory cell C21 is the first storing state.

On the other hand, if the selected memory cell C21 has the second storing state (e.g. the storing state "1"), the cell current Icell is lower than the reference current Iref. When the voltage Va at the node a is discharged to the comparing voltage VDL, the voltage Vb at the node b is maintained at a magnitude near the first supply voltage source Vdd. Under this circumstance, the voltage Va at the node a is lower than the voltage Vb at the node b. Consequently, the output signal OUT from the operation amplifier OP2 is in a low level state to indicate that the storing state of the selected memory cell C21 is the second storing state.

Figure 1:
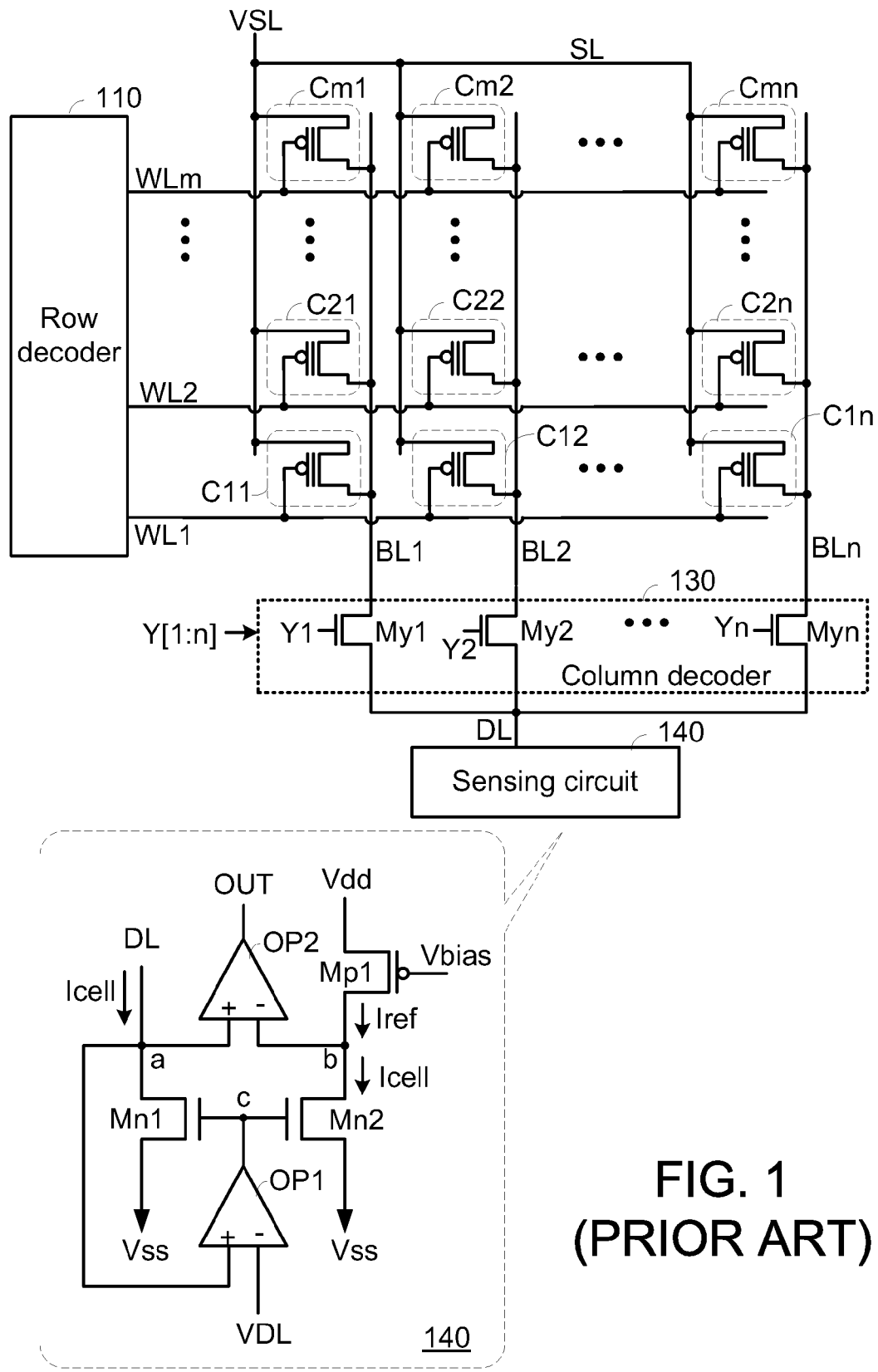
FIG. 1 (prior art) is a schematic circuit diagram illustrating a conventional non-volatile memory.
Figure 2:
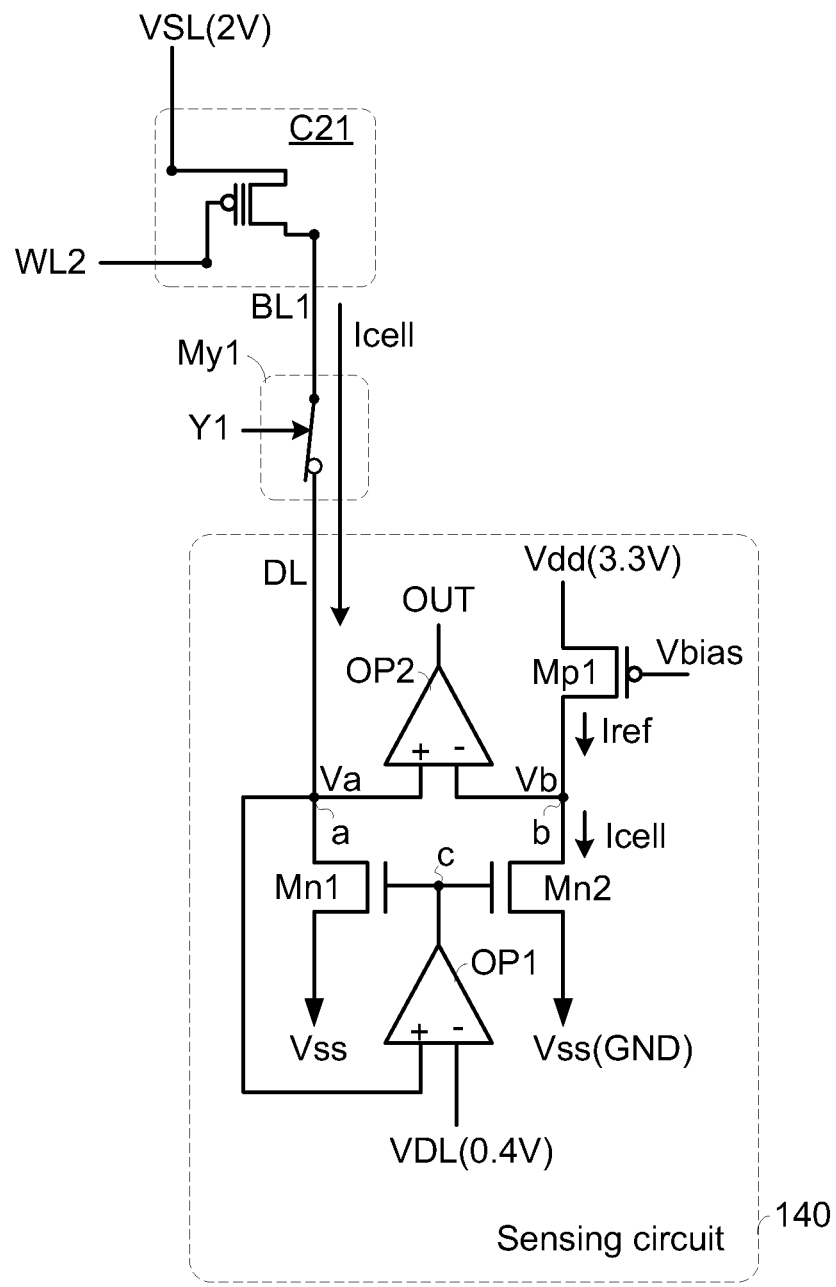
FIG. 2 (prior art) is a schematic circuit diagram illustrating the relationship between the sensing circuit and the selected memory cell C21 of the conventional non-volatile memory.

Please refer to FIG. 4 again. When the switch unit Sy1 of the column decoder 330 is changed from the first switching state to the first switching state, the voltage Va at the node a (i.e. the voltage at the data line DL) is discharged from only the reference voltage Vref (e.g. 0.45V) to the comparing voltage VDL (e.g. 0.4V). As previously described in FIG. 2, the voltage Va at the node a (i.e. the voltage at the data line DL) is discharged from the source line voltage VSL (e.g. 2V) to the comparing voltage VDL (e.g. 0.4V). In other words, the discharging time of the data line DL of the non-volatile memory according to the present invention is largely reduced. Since the delaying time between the start time point of the read cycle and the time point of generating the output signal OUT is shortened, the read speed of the memory cell can be effectively enhanced.

Figure 5:
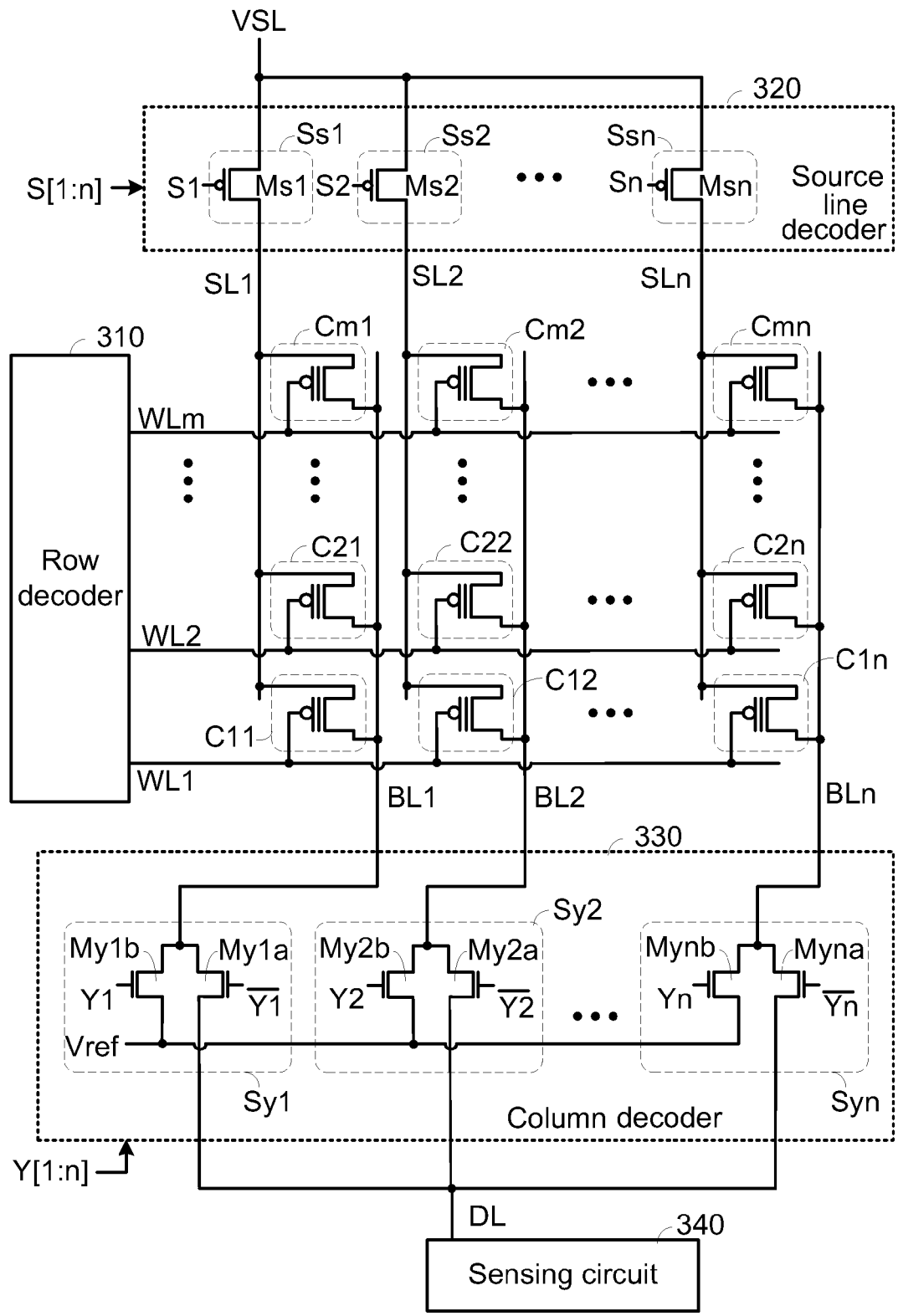
FIG. 5 is a schematic circuit diagram illustrating an exemplary circuitry configuration of the source line decoder and the column decoder of the non-volatile memory according to the embodiment of the present invention.

FIG. 5 is a schematic circuit diagram illustrating an exemplary circuitry configuration of the source line decoder and the column decoder of the non-volatile memory according to the embodiment of the present invention. As shown in FIG. 5, the n switch units Ss1~Ssn of the source line decoder 320 comprise respective switch transistors Ms1~Msn. According to a source control signal S[1:n], the source line decoder 320 generates the n source switch signals S1~Sn. According to the n source switch signals S1~Sn, one of the n switch transistors Ms1~Msn is in the close state but the others of the n switch transistors Ms1~Msn are in the open state. For example, the switch unit Ss1 comprises the switch transistors Ms1. A first terminal of the switch transistors Ms1 receives the source line voltage VSL, a second terminal of the switch transistors Ms1 is connected with the source line SL1, and a control terminal of the switch transistors Ms1 receives the source switch signal S1. The relationships between the other switch units Ss2~Ssn of the source line decoder 320 and the corresponding signal lines are similar to the relationship between the switch unit Ss1 and the corresponding signal lines, and are not redundantly described herein.

As shown in FIG. 5, the n switch units Sy1~Syn of the column decoder 330 comprise respective first switch transistors My1a~Myna and respective second switch transistors My1b~Mynb. According to the column control signal Y[1:n], the column decoder 330 generates the n column switch signals Y1~Yn and n inversed column switch signals $\overline{Y1}$~$\overline{Yn}$. According to the n column switch signals Y1~Yn and the n inversed column switch signals $\overline{Y1}$~$\overline{Yn}$, one of the switch units Sy1~Syn is in the first switching state but the other switch units of the column decoder 330 are in the second switching state. For example, the switch unit Sy1 comprises the first switch transistor My1a and the second switch transistor My1b. A first terminal of the first switch transistor My1a is connected with the bit line BL1, a second terminal of the first switch transistor My1a is connected with the data line DL, and a control terminal of the first switch transistor My1a receives the inversed column switch signal $\overline{Y1}$. A first terminal of the second switch transistor My1b is connected with the bit line BL1, a second terminal of the second switch transistor My1b is connected with the reference voltage Vref, and a control terminal of the second switch transistor My1b receives the column switch signal Y1. The relationships between the other switch units Sy2~Syn of the column decoder 330 and the corresponding signal lines are similar to the relationship between the switch unit Sy1 and the corresponding signal lines, and are not redundantly described herein.

In the embodiment of FIG. 5, the source control signal S[1:n] and the column control signal Y[1:n] may be replaced by a single control signal C[1:n].

For example, if the memory cell C21 is the selected memory cell, the word line WL2 is firstly enabled. Then, the n-bit control signal C[1:n] is set as C[1, 0, . . . , 0]. That is, the first bit of the control signal C[1:n] is "1", but the other (n−1) bits of the control signal C[1:n] is "0". In addition, the control signal C[1:n] is used as the source control signal S[1:n] and the column control signal Y[1:n]. Consequently, in the source line decoder 320, only the switch unit Ss1 is in the close state, but the other switch units Ss2~Ssn are in the close state. Moreover, in the column decoder 330, only the switch unit Sy1 is in the first switching state, but the other switch units Sy2~Syn are in the second switching state.

In the above embodiment, the memory cell comprises a single floating gate transistor. In some other embodiments, the memory cell of the memory array may comprise plural transistors.

Figure 6:
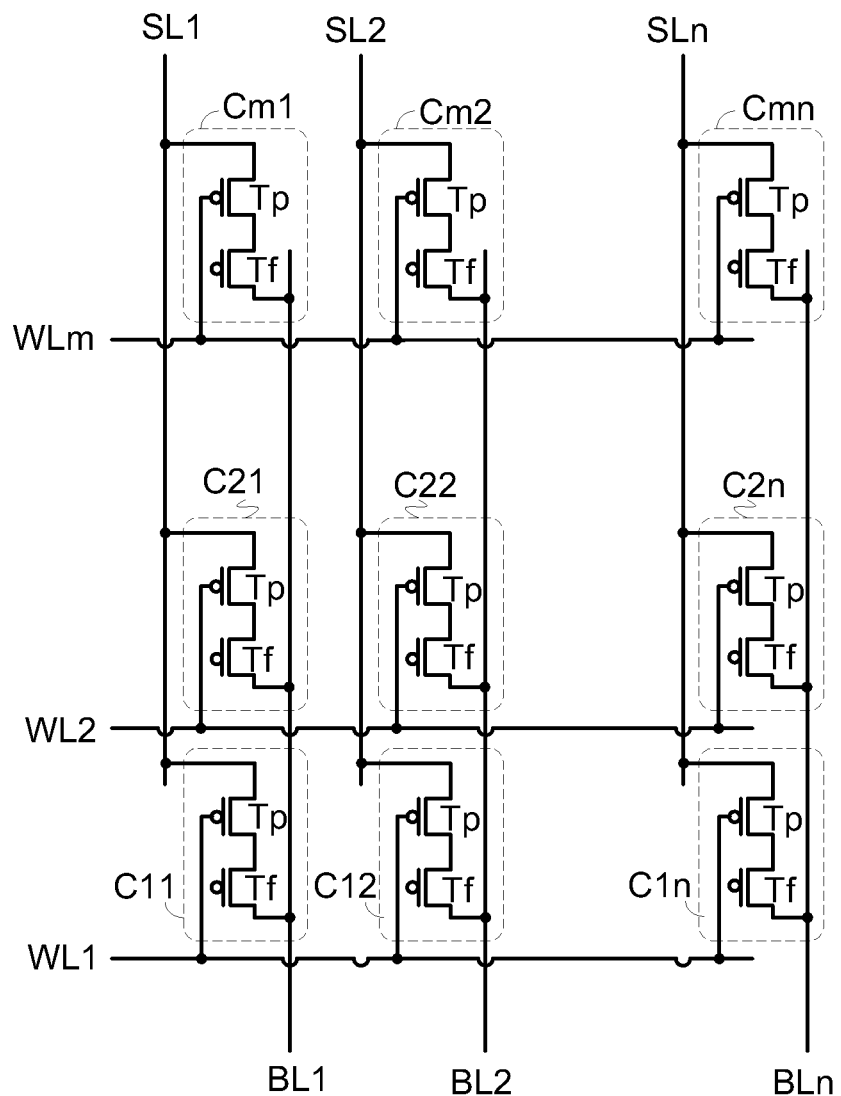
FIG. 6 is a schematic circuit diagram illustrating a memory array of a non-volatile memory according to another embodiment of the present invention.

FIG. 6 is a schematic circuit diagram illustrating a memory array of a non-volatile memory according to another embodiment of the present invention. The relationships between the row decoder 310, the source line decoder 320, the column decoder 330 and memory array are similar to those of FIG. 3, and are not redundantly described herein.

Similarly, the memory array is connected with the m word lines WL1~WLm, the n source lines SL1~SLn and the n bit lines BL1~BLn. The memory array comprises m×n memory cells C11~Cmn. Each of the memory cells comprises a P-type transistor Tp and a floating gate transistor Tf. Moreover, each of the memory cells is connected with the corresponding word line, the corresponding bit line and the corresponding source line. Take the memory cell C11 as an example. The source terminal of the P-type transistor Tp is connected with the source line SL1, the gate terminal of the P-type transistor Tp is connected with the word line WL1, and the drain terminal of the P-type transistor Tp is connected with a first terminal of the floating gate transistor Tf. A second terminal of the floating gate transistor Tf is connected with the bit line BL1. The relationships between the other memory cells of the memory array and the corresponding signal lines are similar to the relationship between the memory cell C11 and the corresponding signal lines.

From the above descriptions, the non-volatile memory of the present invention is additionally equipped with the source line decoder 320. The the source line decoder 320 and the column decoder 330 cooperate with each other. During the read cycle, the discharging time of the data line DL is largely reduced. Consequently, the read speed of the memory cell can be effectively enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory, comprising:
    a memory array comprising m×n memory cells, wherein the memory array is connected with m word lines, n source lines and n bit lines;
    a row decoder connected with the m word lines for enabling one of the m word lines, thereby determining a selected row of n memory cells, wherein the n memory cells in the selected row are connected with the n source lines and the n bit lines;
    a source line decoder connected with the n source lines, wherein by the source line decoder, an x-th source line of the n source lines is connected with a source line voltage but the other source lines of the n source lines are in a floating state;
    a column decoder connected with the n bit lines, wherein by the column decoder, an x-th bit line of the n bit lines is connected with a data line but the other bit lines of the n bit lines are connected with a reference voltage; and
    a sensing circuit connected with the column decoder through the data line, wherein the sensing circuit determines a storing state of a selected memory cell according to a memory current flowing through the data line, wherein x is a positive integer and 1≤x≤n.

2. The non-volatile memory as claimed in claim 1, wherein a first memory cell of the m×n memory cells comprises a floating gate transistor, wherein a control gate terminal of the floating gate transistor is connected with a first word line of the m word lines, a source terminal of the floating gate transistor is connected with a first source line of the n source lines, and a drain terminal of the floating gate transistor is connected with a first bit line of the n bit lines.

3. The non-volatile memory as claimed in claim 1, wherein a first memory cell of the m×n memory cells comprises:
    a P-type transistor, wherein a gate terminal of the P-type transistor is connected with a first word line of the m word lines, a source terminal of the P-type transistor is connected with a first source line of the n source lines; and
    a floating gate transistor, wherein a first terminal of the floating gate transistor is connected with a drain terminal of the P-type transistor, and a second terminal of the floating gate transistor is connected with a first bit line of the n bit lines.

4. The non-volatile memory as claimed in claim 1, wherein the source line decoder comprises n switch units, and the n switch units are connected with the n source lines, respectively, wherein according to a source control signal, the x-th source line of the n source lines is connected with the source line voltage but the other source lines of the n source lines are floating.

5. The non-volatile memory as claimed in claim 4, wherein each of the n switch units of the source line decoder comprises a switch transistor, wherein an x-th switch transistor is in a close state but the other switch transistors are in an open state.

6. The non-volatile memory as claimed in claim 1, wherein the column decoder comprises n switch units, and the n switch units are connected with the n bit lines, respectively, wherein according to a column control signal, the x-th bit line of the n bit lines is connected with the data line but the other bit lines of the n bit lines are connected with the reference voltage.

7. The non-volatile memory as claimed in claim 6, wherein each of the n switch units of the column decoder comprises a first switch transistor and a second switch transistor, wherein when the switch unit is in a first switching state, the first switch transistor is in a close state and the second switch transistor is in an open state, wherein when the switch unit is in a second switching state, the first switch transistor is in the open state and the second switch transistor is in the close state.

8. The non-volatile memory as claimed in claim 1, wherein the sensing circuit comprises:
    a current source for generating a cell current;
    a first node connected with the data line for receiving the cell current;
    a second node connected with the current source for receiving the reference current;
    a current mirror, wherein an input terminal of the current mirror is connected with the first node, and a mirroring terminal of the current mirror is connected with the second node; and
    a comparator, wherein two input terminals of the comparator are connected with the first node and the second node, respectively, and an output terminal of the comparator generates an output signal to indicate the storing state of the selected memory cell.

9. The non-volatile memory as claimed in claim 8, wherein the current source comprises a P-type transistor, wherein a source terminal of the P-type transistor is connected with a first supply voltage source, a gate terminal of the P-type transistor receives a bias voltage, and a drain terminal of the P-type transistor is connected with the second node.

10. The non-volatile memory as claimed in claim 8, wherein the current mirror further comprises:
    a first N-type transistor, wherein a drain terminal of the first N-type transistor is connected with the first node, and a source terminal of the first N-type transistor is connected with a second supply voltage source;
    a second N-type transistor, wherein a drain terminal of the second N-type transistor is connected with the second node, a source terminal of the second N-type transistor is connected with the second supply voltage source, and a gate terminal of the second N-type transistor is connected with a gate terminal of the first N-type transistor; and
    an operation amplifier, wherein a positive input terminal of the operation amplifier is connected with the first node, a negative input terminal of the operation amplifier receives a comparing voltage, and an output terminal of the operation amplifier is connected with the gate terminal of the first N-type transistor.

11. The non-volatile memory as claimed in claim 10, wherein the reference voltage is lower than the source line voltage, and the reference voltage is higher than or equal to the comparing voltage.

* * * * *